US007823275B2

(12) United States Patent
Chou

(10) Patent No.: US 7,823,275 B2
(45) Date of Patent: Nov. 2, 2010

(54) METHOD FOR MAKING AN ELECTRONIC SWITCH THAT IS MOUNTABLE ON A CIRCUIT BOARD

(76) Inventor: Tien-Ming Chou, No. 41, San-Hsi 5th St., Taichung City (TW)

( * ) Notice: Subject to any disclaimer, the term of this patent is extended or adjusted under 35 U.S.C. 154(b) by 138 days.

(21) Appl. No.: 12/194,046

(22) Filed: Aug. 19, 2008

(65) Prior Publication Data

US 2010/0043209 A1 Feb. 25, 2010

(51) Int. Cl.
*H05K 3/10* (2006.01)

(52) U.S. Cl. ............................ 29/832; 29/622; 29/825; 607/36

(58) Field of Classification Search .................. 29/825, 29/832, 622; 607/36
See application file for complete search history.

(56) References Cited

U.S. PATENT DOCUMENTS

| | | | | |
|---|---|---|---|---|
| 4,558,513 | A * | 12/1985 | Buss | 29/622 |
| 5,835,350 | A * | 11/1998 | Stevens | 361/704 |
| 6,026,325 | A * | 2/2000 | Weinberg et al. | 607/36 |
| 6,324,428 | B1 * | 11/2001 | Weinberg et al. | 607/36 |

FOREIGN PATENT DOCUMENTS

| | | | |
|---|---|---|---|
| DE | 1665294 | A1 | 1/1971 |
| DE | 60031495 | T2 | 6/2007 |
| EP | 0367204 | A2 | 5/1990 |
| EP | 1858042 | A1 | 11/2007 |
| TW | 155965 | | 10/1998 |
| WO | 2008010678 | A1 | 1/2008 |

* cited by examiner

*Primary Examiner*—C. J Arbes
(74) *Attorney, Agent, or Firm*—McNees Wallace & Nurick, LLC

(57) ABSTRACT

A method for making an electronic switch mountable on a circuit board includes the steps of: (A) providing a housing that includes a base having opposite inner and outer sides, and a cover body having a main portion that cooperates with the inner side of the base to define a chamber, and an end portion that cooperates with the outer side of the base to define a sealing space; (B) providing a terminal having a connecting part extending through the base and the sealing space for connection with the circuit board; (C) providing the base with a hollow portion that projects outwardly from the outer side thereof into the sealing space and that confines an air-discharge hole communicating fluidly with the chamber; (D) providing a first adhesive layer to seal the sealing space without covering the air-discharge hole; and (E) sealing the air-discharge hole.

2 Claims, 10 Drawing Sheets

METHOD FOR MAKING AN ELECTRONIC SWITCH THAT IS MOUNTABLE ON A CIRCUIT BOARD

BACKGROUND OF THE INVENTION

1. Field of the Invention

The invention relates to a switch, more particularly to a method for making an electronic switch that is mountable on a circuit board.

2. Description of the Related Art

Referring to FIGS. 1 and 2, a conventional electronic switch 10, as disclosed by the applicant in Taiwanese Patent No. 155965, includes a top cover 11, a conductive ball 12 disposed in the top cover 11, a base 13, and four terminals 14. The top cover 11 is made of plastic, and has a cover main wall 111, and four interconnected sidewalls 112 extending downwardly from a peripheral end of the cover main wall 111. The cover main wall 111 and the sidewalls 112 cooperatively define a chamber 113 having a bottom opening 114. The conductive ball 12 is disposed in the chamber 113. The base 13 is made of plastic, and is inserted into the chamber 113 so as to close the bottom opening 114, thereby confining the conductive ball 12 within the chamber 113. The base 13 has top and bottom surfaces, and four spaced-apart through holes 131 extending through the top and bottom surfaces.

The terminals 14 are inserted respectively into the through holes 131 by a jig (not shown) so as to position the terminals 14 in the respective through holes 131. An epoxy resin 15 is filled within a space defined among the sidewalls 112 of the top cover 11, a bottom surface of the base 13, and the terminals 14, after which an assembly of the top cover 11, the base 13, and the terminals 14 is sent to an oven (not shown) so as to cure the epoxy resin 15, thereby obtaining the conventional electronic switch 10.

Although the aforementioned conventional electronic switch 10 can achieve its intended purpose, during heating of the assembly of the top cover 11, the base 13, and the terminals 14 in the oven, air in the chamber 113 expands when subjected to the high temperature of the oven, and escapes out of the electronic switch 10 through the epoxy resin 15. As a consequence, the epoxy resin 15 is formed with cracks 16, and the surface thereof is rough. Not only is the appearance of the electronic switch 10 affected, but also, the watertight capability of the electronic switch 10 is adversely affected due to the presence of the cracks 16. Hence, the electronic switch 10 gets moist easily, ultimately leading to reductions in the quality and service life of the electronic switch 10.

SUMMARY OF THE INVENTION

Therefore, the object of the present invention is to provide a method for making an electronic switch that is capable of overcoming the aforementioned drawbacks of the prior art.

According to this invention, a method for making an electronic switch mountable on a circuit board comprises the steps of: (A) providing a housing that includes a base having opposite inner and outer sides, and a cover body having a main portion that cooperates with the inner side of the base to define a chamber, and an end portion extending from the main portion to the outer side of the base and cooperating with the outer side of the base to define a sealing space; (B) providing a terminal having a connecting part extending through the base and the sealing space for connection with the circuit board; (C) providing the base with a hollow portion that projects outwardly from the outer side of the base into the sealing space and that confines an air-discharge hole communicating fluidly with the chamber; (D) providing a first adhesive layer to seal the sealing space without covering the air-discharge hole; and (E) sealing the air-discharge hole.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
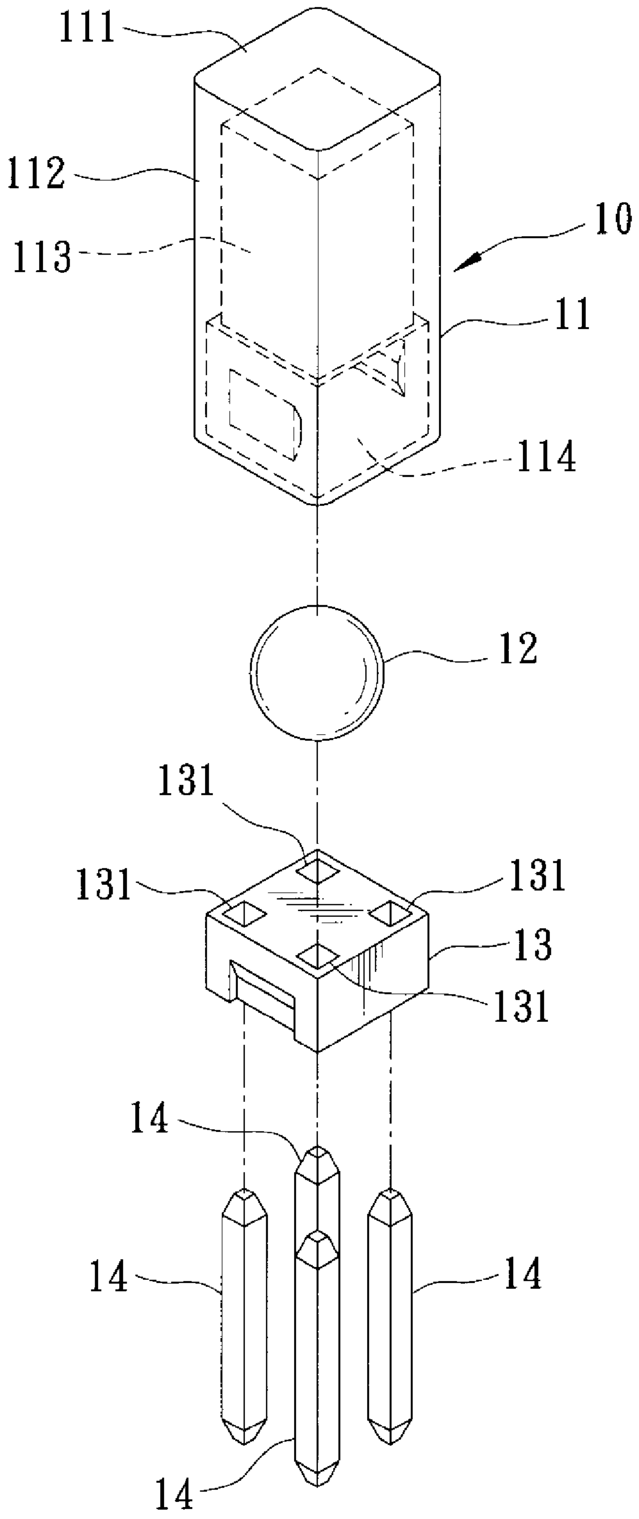
FIG. 1 PRIOR ART
FIG. 1 is an exploded perspective view of a conventional electronic switch disclosed in Taiwanese Patent No. 155965.
Figure 2:
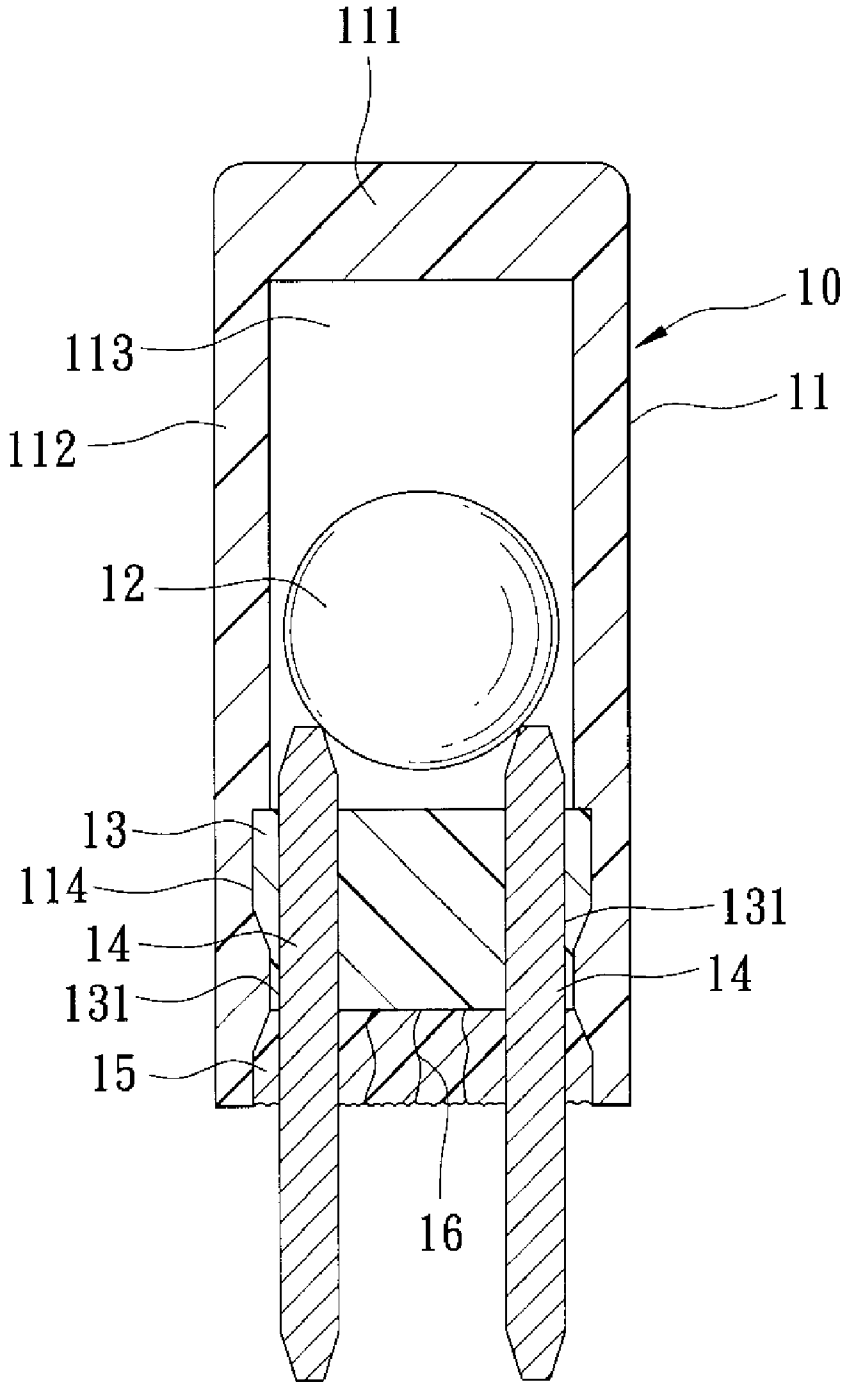
FIG. 2 PRIOR ART
FIG. 2 is a sectional view of the conventional switch of FIG. 1 in an assembled state.

Before the present invention is described in greater detail, it should be noted that the same reference numerals have been used to denote like elements throughout the specification.

Figure 3:
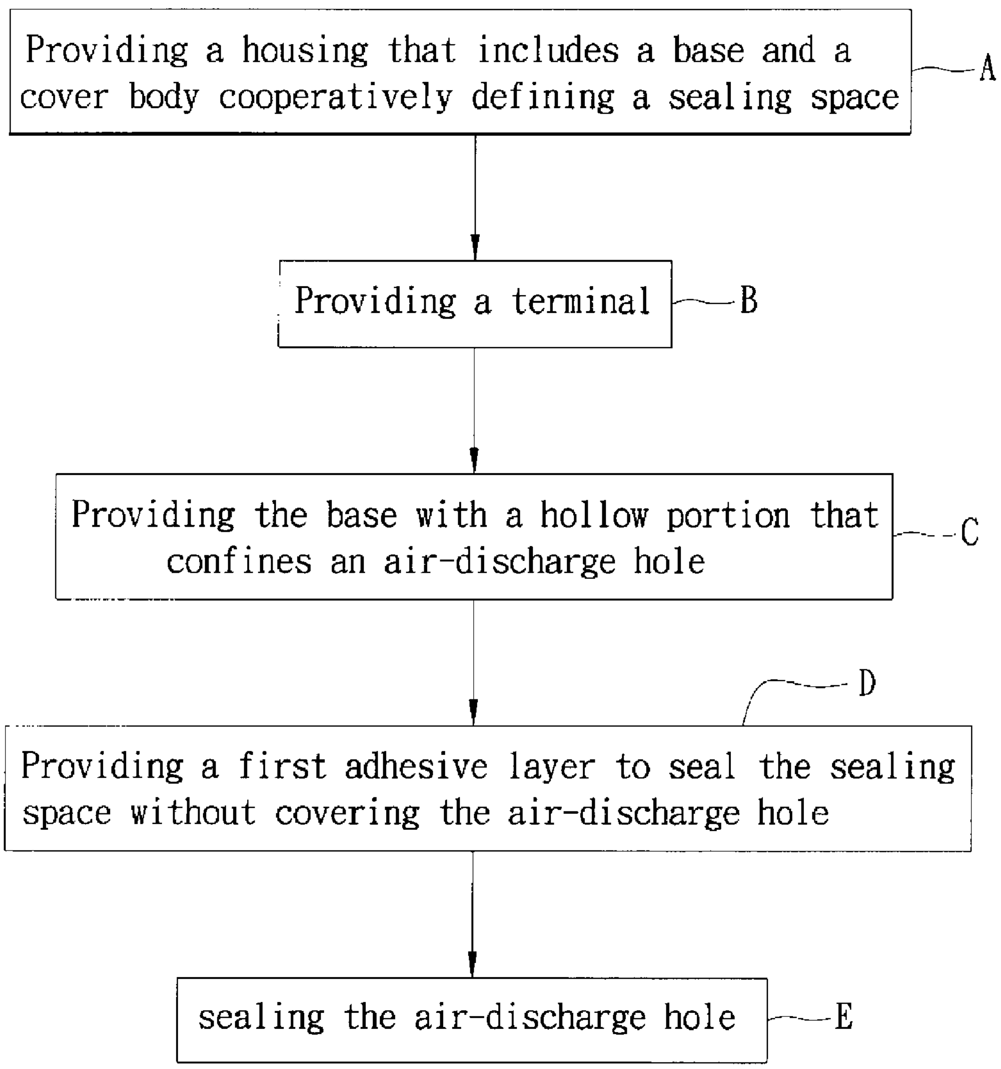
FIG. 3 is a flow chart, illustrating the steps involved in making an electronic switch according to the first preferred embodiment of the present invention.
Figure 4:
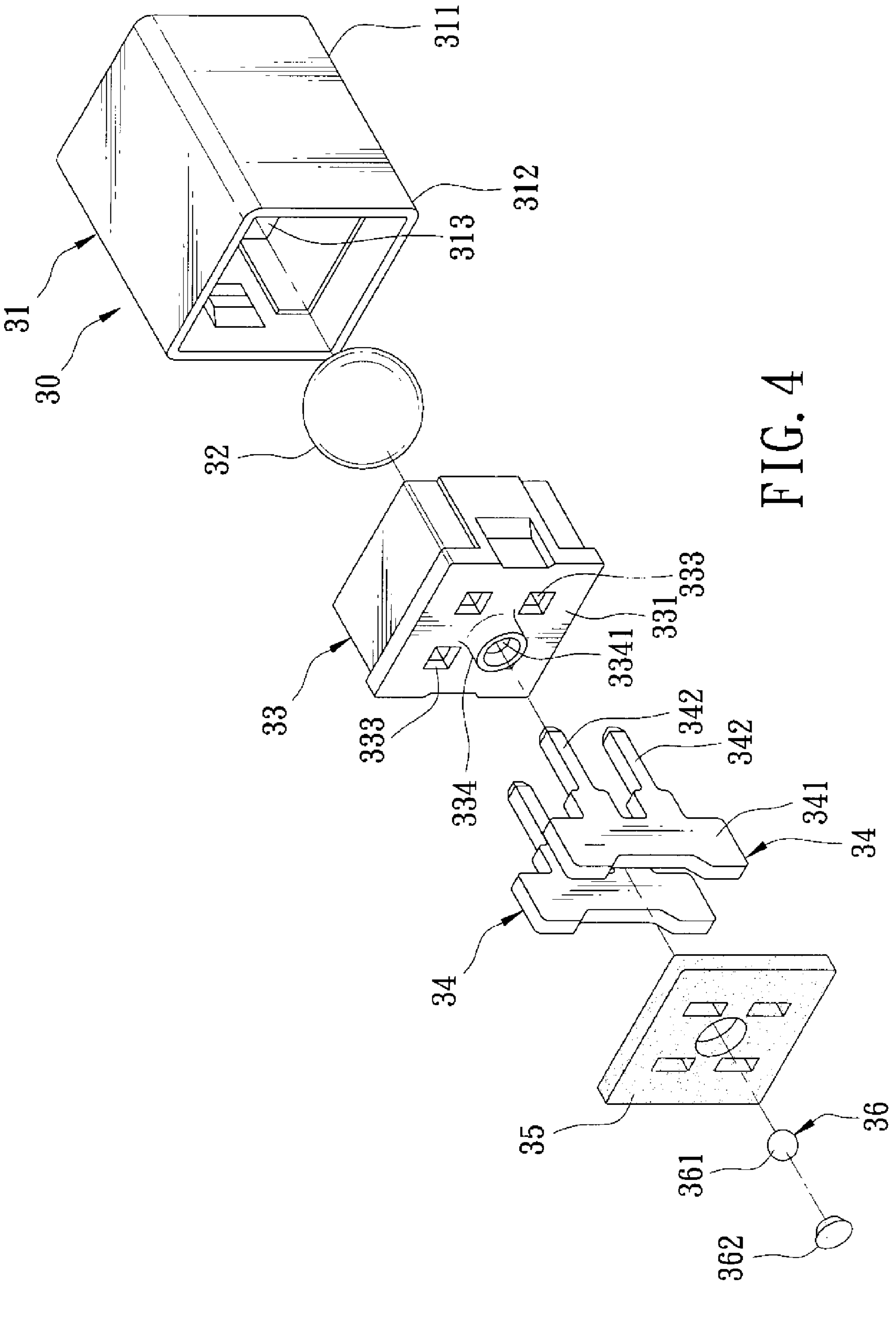
FIG. 4 is an exploded perspective view of the electronic switch of the first preferred embodiment.
Figure 5:
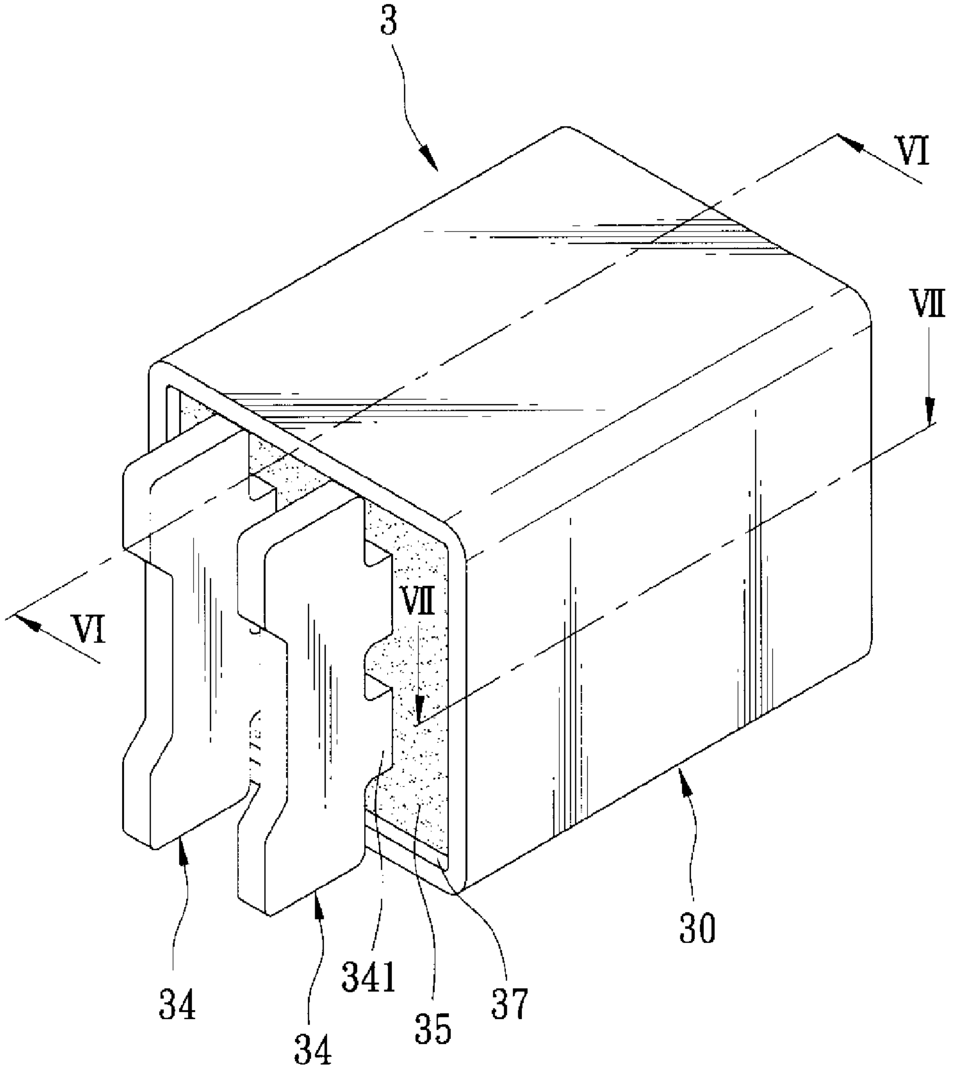
FIG. 5 is a perspective view of the first preferred embodiment in an assembled state.
Figure 6:
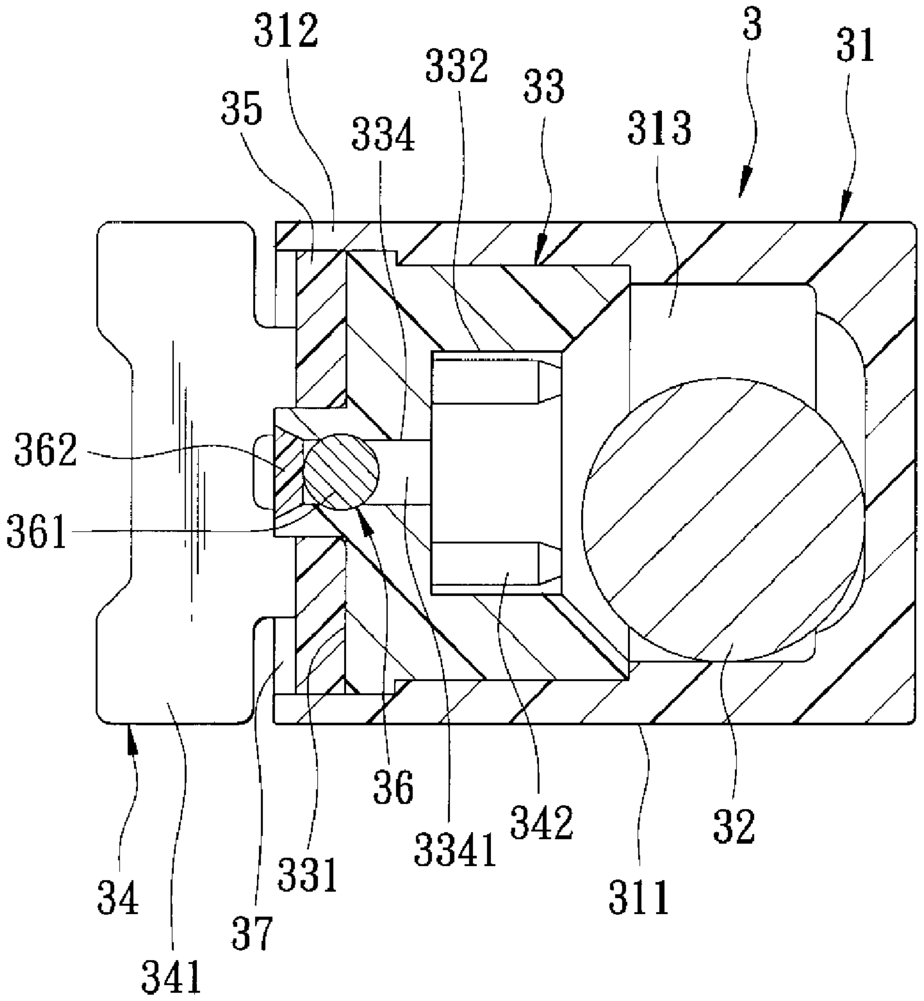
FIG. 6 is a sectional view of the first preferred embodiment taken along line VI-VI of FIG. 5.
Figure 7:
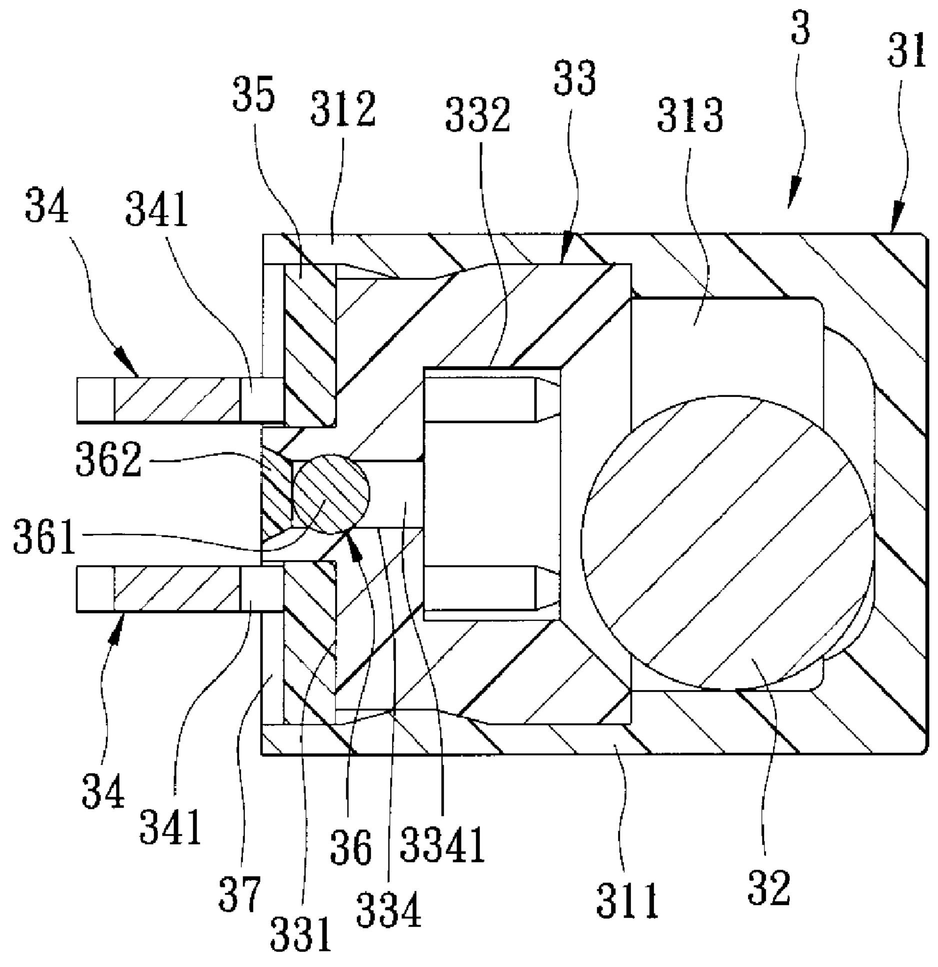
FIG. 7 is a sectional view of the first preferred embodiment taken along line VII-VII of FIG. 5.

Referring to FIG. 3, a method for making an electronic switch 3 according to the first preferred embodiment of the present invention is shown to comprise steps (A) to (E). These steps (A) to (E) will be described in greater detail below in combination with FIGS. 4 to 7.

In step (A), a housing 30 is provided. The housing 30 includes a base 33, a cover body 31, and a conductive ball 32. The base 33 is made of plastic, and has an inner side 332, an outer side 331 opposite to the inner side 332, and four spaced-apart through holes 333 extending through the outer and inner sides 331, 332 and communicating fluidly with a chamber 313. The cover body 31 is made of plastic, and has a main portion 311 that cooperates with the inner side 332 of the base 33 to define the chamber 313, and an end portion 312 extending from the main portion 311 to the outer side 331 of the base 33 and cooperating with the outer side 331 to define a sealing space 37. The conductive ball 32 is disposed rollably in the chamber 313.

In step (B), two terminals 34 are provided on the housing 30. In this embodiment, each of the terminals 34, has a connecting part 341 extending through the base 33 and the sealing space 37 and adapted to be connected to a circuit board (not shown), and two spaced-apart contact parts 342 extending from the connecting part 341 into the chamber 313 so as to contact the conductive ball 32. The two contact parts 342 of each terminal 34 are inserted through the respective two of the through holes 333 in the base 33 and into the chamber 313 by using a jig (not shown).

In step (C), the base 33 is provided with a hollow portion 334 that projects outwardly from the outer side 331 of the base 33 and that confines an air-discharge hole 3341 communicating fluidly with the chamber 313.

In step (D), a first adhesive layer 35 is disposed in the sealing space 37 without covering the air-discharge hole 3341.

In step (E), after the first adhesive layer 35 is cured, a sealing unit 36 is attached to the base 33 so as to seal the air-discharge hole 3341. A common method to cure the first adhesive layer 35 quickly so as to shorten the manufacturing time is to place the housing 30 in an oven (not shown) that is set to a high temperature. However, natural curing at room temperature may also be employed to cure the first adhesive layer 35, in which case the manufacturing time is increased. In either case, during curing of the first adhesive layer 35, air in the chamber 313 can be discharged outwardly of the housing 30 via the air-discharge hole 3341, so that cracks in the first adhesive layer 35 are not formed. Hence, an outer surface of the first adhesive layer 35 remains flat and smooth, thereby enhancing an appearance of the housing 30.

The sealing unit 36, in this embodiment, includes a plug body 361 and a second adhesive layer 362. The plug body 361 is a steel ball having a diameter larger than that of the air-discharge hole 3341. The steel ball or plug body 361 is inserted into the air-discharge hole 3341 by using a jig (not shown), after which the second adhesive layer 362 is disposed in the air-discharge hole 3341 externally of the plug body 361, thereby sealing any gaps that may be present between the air-discharge hole 3341 and the plug body 361.

Finally, after the second adhesive layer 362 is cured, the electronic switch 3 of the first preferred embodiment is obtained. In this embodiment, the electronic switch 3 is a contact-type electronic switch.

The electronic switch 3 of the first preferred embodiment, as described above, comprises the housing 30 including the cover body 31, the conductive ball 32, and the base 33, the two terminals 34, the hollow portion 334, the first adhesive layer 35, and the sealing unit 36.

Figure 8:
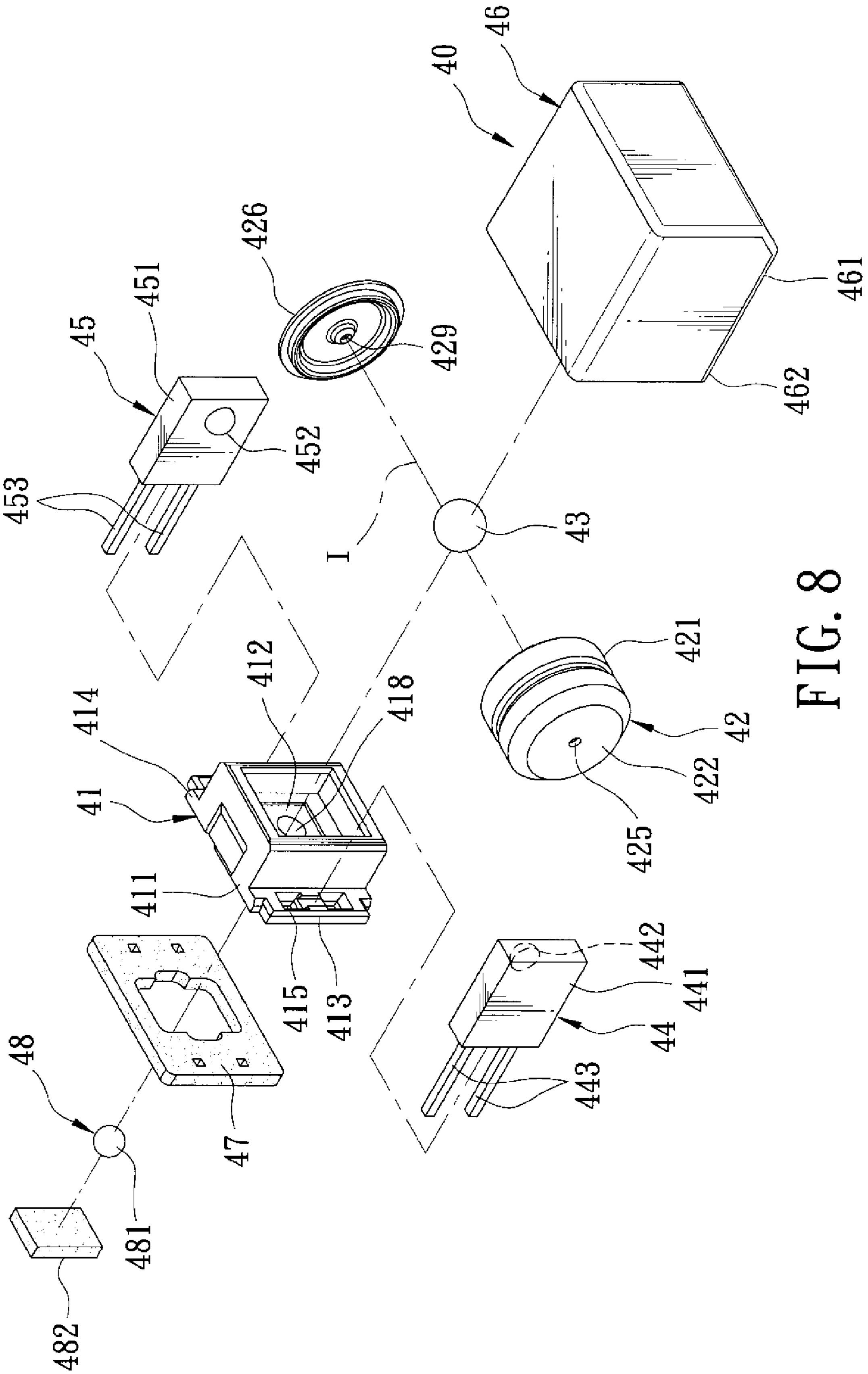
FIG. 8 is an exploded perspective view of an electronic switch according to the second preferred embodiment of the present invention.
Figure 9:
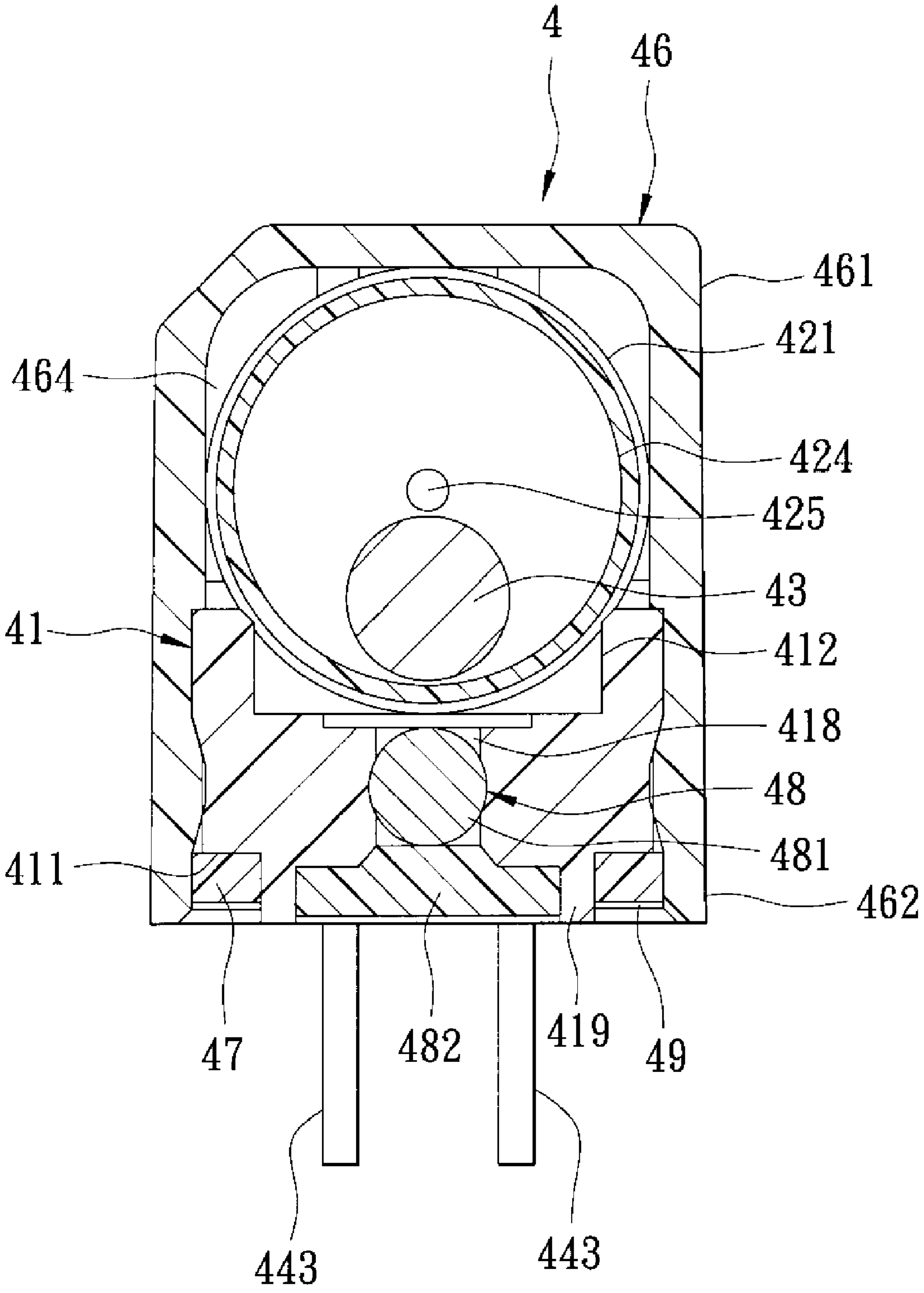
FIG. 9 is a sectional view of the second preferred embodiment in an assembled state.
Figure 10:
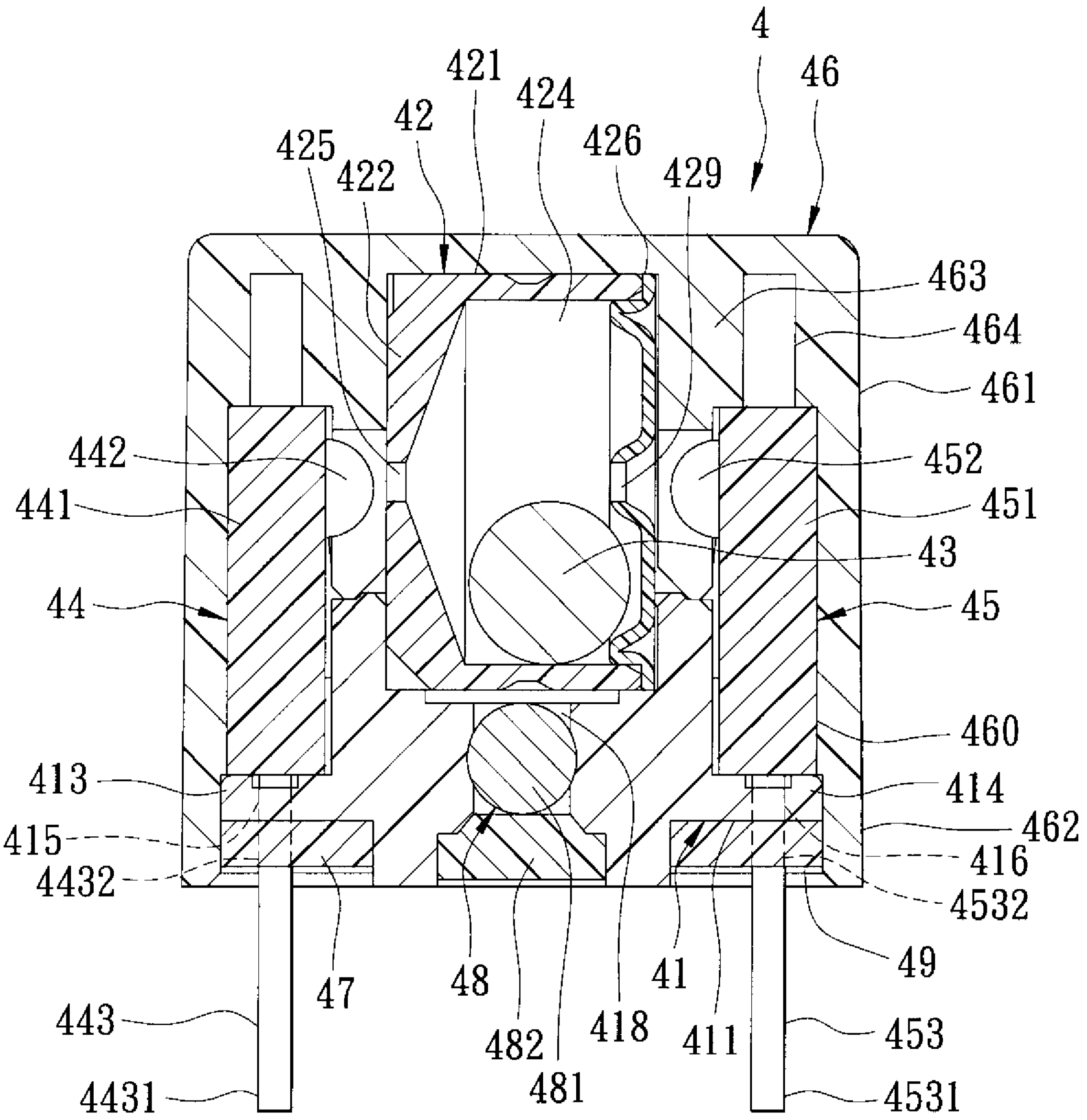
FIG. 10 is another sectional view of the second preferred embodiment in an assembled state.

Referring to FIGS. 8 to 10, in combination with FIG. 3, a method for making an electronic switch 4 according to the second preferred embodiment of the present invention is shown to be similar to the first preferred embodiment. Particularly, the method comprises the steps (A) to (E).

In step (A), a housing 40 is provided. The housing 40 includes a base 41 and a cover body 46. The base 41 includes an inner side 412, an outer side 411 opposite to the inner side 412, and first and second wing plates 413, 414 extending outwardly and oppositely from the outer side 411. Each of the first and second wing plates 413, 414 is formed with two spaced-apart through holes 415, 416. The cover body 46 has a main portion 461, and an end portion 462 extending from the main portion 461 to the outer side 411 of the base 41 and cooperating with the outer side 411 to define a sealing space 49. The main portion 461 has an annular rib 463 projecting downwardly from an upper inner wall face thereof and cooperating with the inner side 412 of the base 41 to define a chamber 464.

In step (B), two terminals 443 and two terminals 453 are provided in the chamber 464. Each of the terminals 443, 453 has a connecting part 4431, 4531 extending through the base 41 and the sealing space 49 and adapted to be connected to a circuit board (not shown), and a coupling part 4432, 4532 extending from the connecting part 4431, 4531 into the respective through hole 415, 416. A light emitter 44 is coupled to the coupling parts 4432 of the terminals 443, and includes an emitter main body 441 seated on the first wing plate 413, and an emitter head 442 projecting from one side of the emitter main body 441 to emit a light signal. A light receiver 45 is coupled to the coupling parts 4532 of the terminals 453, and includes a receiver main body 451 seated on the second wing plate 414, a receiver head 452 projecting from one side of the receiver main body 451 to receive the light signal emitted by the emitter head 442. The annular rib 463 presses against the emitter and receiver main bodies 441, 451.

A receptacle 42 is disposed between the base 41 and the cover body 46, and includes a first wall 422 proximate to the light emitter 44 and having a light entry hole 425 aligned with the emitter head 442, a second wall 426 opposite to the first wall 422 and proximate to the light receiver 45, and a tubular wall 421 connected between the first and second walls 422, 426. The first and second walls 422, 426 and the tubular wall 421 cooperatively define a chamber 424. The first wall 422 and the tubular wall 421 are formed integrally, while the second wall 426 is a plate formed separately from the tubular wall 421. The second wall 426 abuts against an end face of the tubular wall 421, and has a light exit hole 429 aligned with the receiver head 452. The light entry hole 425 and the light exit hole 429 are aligned with each other along a light path (I).

A conductive ball 43 is disposed rollably within the chamber 424 between the light emitter 44 and the light receiver 45, and has a diameter smaller than a distance from the tubular wall 421 to the light path (I), so that the conductive ball 43 can block and unblock the light path (I).

In step (C), the base 41 is provided with a hollow portion 419 that projects outwardly from the outer side 411 of the base 41 and that confines an air-discharge hole 418 communicating fluidly with the chamber 464.

In step (D), a first adhesive layer 47 is disposed in the sealing space 49 without covering the air-discharge hole 418.

In step (E), after the first adhesive layer 47 is cured, a sealing unit 48 is attached to the base 41 so as to seal the air-discharge hole 418. Similarly, the housing 40 may be placed in a high-temperature oven for quick curing of the first adhesive layer 47, or the first adhesive layer 47 may be cured naturally at room temperature. In either case, during curing of the first adhesive layer 47, air in the chamber 464 can be discharged outwardly of the housing 40 via the air-discharge hole 418, so that cracks are not formed in the first adhesive layer 47. Hence, an outer surface of the first adhesive layer 47 remains flat and smooth, thereby enhancing an appearance of the housing 40. The sealing unit 48, in this embodiment, includes a plug body 481 and a second adhesive layer 482. The plug body 481 is a steel ball having a diameter larger than that of the air-discharge hole 418. The steel ball or plug body 481 is inserted into the air-discharge hole 418 by using a jig (not shown), after which the second adhesive layer 482 is disposed in the air-discharge hole 418 externally of the plug body 481, thereby sealing any gaps that may be present between the air-discharge hole 418 and the plug body 481.

Finally, after the second adhesive layer 482 is cured, the electronic switch 4 of the second preferred embodiment is obtained. In this embodiment, the electronic switch 4 is a photoelectric switch.

The electronic switch 4 of the second preferred embodiment includes the base 41, the receptacle 42, the conductive ball 43, the terminals 443, the terminals 453, the light emitter 44, the light receiver 45, the cover body 46, the hollow portion 419, the first adhesive layer 47, and the sealing unit 48.

It is worth mentioning that although the sealing unit 36, 48 is described in the first and second preferred embodiments of the present invention as including the plug body 361, 481 and the second adhesive layer 362, 482, it is not limited as such. In an alternative embodiment, a sealing tape may be used to seal the air-discharge hole 3341, 418.

The advantages and effects of the present invention are summarized hereinafter.

Because air in the chamber 313, 464 can be discharged outwardly of the housing 30, 40 via the air-discharge hole 3341, 418 during curing of the first adhesive layer 35, 47, the first adhesive layer 35, 47 of the present invention is prevented from undergoing cracking. Hence, a watertight capability of the electronic switch 3, 4 of the present invention is maintained. This results in enhancing the quality and in prolonging the service life of the electronic switch 3, 4. Further, since the first adhesive layer 35, 47 has no cracks, an outer surface thereof remains flat and smooth, thereby enhancing the appearance of the present invention.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

I claim:

1. A method for making an electronic switch mountable on a circuit board, comprising:

(A) providing a housing that includes a base having an inner side and an outer side opposite to said inner side, and a cover body having a main portion that cooperates with said inner side of said base to define a chamber, and an end portion extending from said main portion to said outer side of said base and cooperating with said outer side of said base to define a sealing space;

(B) providing a terminal having a connecting part extending through said base and said sealing space for connection with the circuit board;

(C) providing said base with a hollow portion that projects outwardly from said outer side of said base into said sealing space and that confines an air-discharge hole communicating fluidly with said chamber;

(D) providing a first adhesive layer to seal said sealing space without covering said air-discharge hole; and (E) sealing said air-discharge hole, wherein, in step (E), a plug body is inserted into said air-discharge hole to seal said air-discharge hole.

2. A method for making an electronic switch mountable on a circuit board, comprising:

(A) providing a housing that includes a base having an inner side and an outer side opposite to said inner side, and a cover body having a main portion that cooperates with said inner side of said base to define a chamber, and an end portion extending from said main portion to said outer side of said base and cooperating with said outer side of said base to define a sealing space;

(B) providing a terminal having a connecting part extending through said base and said sealing space for connection with the circuit board;

(C) providing said base with a hollow portion that projects outwardly from said outer side of said base into said sealing space and that confines an air-discharge hole communicating fluidly with said chamber;

(D) providing a first adhesive layer to seal said sealing space without covering said air-discharge hole; and (E) sealing said air-discharge hole, wherein, in step (E), a plug body is inserted into said air-discharge hole to seal said air-discharge hole and a second adhesive layer is disposed in said air-discharge hole to seal said air-discharge hole externally of said plug body.

* * * * *